(12) United States Patent
Lee

(10) Patent No.: US 8,570,139 B2
(45) Date of Patent: Oct. 29, 2013

(54) VARIABLE RESISTER HAVING RESISTANCE VARYING GEOMETRICALLY RATIO AND CONTROL METHOD THEREOF

(75) Inventor: Jongwoo Lee, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 149 days.

(21) Appl. No.: 13/190,023

(22) Filed: Jul. 25, 2011

(65) Prior Publication Data

US 2012/0019318 A1    Jan. 26, 2012

(30) Foreign Application Priority Data

Jul. 26, 2010 (KR) .................. 10-2010-0071867

(51) Int. Cl.
*H01C 13/00* (2006.01)

(52) U.S. Cl.
USPC ............. 338/215; 330/86; 330/278; 330/144; 330/254

(58) Field of Classification Search
USPC ............................ 330/86, 254, 278, 144, 129; 250/214 LS; 327/561; 338/215
See application file for complete search history.

(56) References Cited

U.S. PATENT DOCUMENTS

| | | | |
|---|---|---|---|
| 4,020,485 A * | 4/1977 | Busby | 341/138 |
| 4,070,632 A * | 1/1978 | Tuttle | 330/86 |
| 6,198,349 B1 * | 3/2001 | Kanno et al. | 330/282 |
| 6,403,943 B2 * | 6/2002 | Wada et al. | 250/214 A |
| 7,248,107 B2 * | 7/2007 | Brekelmans et al. | 330/86 |
| 7,868,701 B2 * | 1/2011 | Nakamura et al. | 330/308 |
| 8,362,870 B2 * | 1/2013 | Hsu | 338/215 |
| 2001/0019288 A1 | 9/2001 | Wada et al. | |
| 2009/0039955 A1 * | 2/2009 | Hosoya | 327/553 |
| 2010/0090746 A1 | 4/2010 | Nakada et al. | |

FOREIGN PATENT DOCUMENTS

| | | |
|---|---|---|
| JP | 10-200377 A | 7/1998 |
| JP | 2010-98399 A | 4/2010 |
| KR | 20-1999-012727 U | 4/1999 |
| KR | 10-0676354 B1 | 1/2007 |

* cited by examiner

*Primary Examiner* — Patricia Nguyen
(74) *Attorney, Agent, or Firm* — Jefferson IP Law, LLP

(57) ABSTRACT

Provided is an analog amplifier for amplifying an analog signal and an analog filter, and in particular, an apparatus and method for controlling gain and cutoff frequency of the variable gain amplifier and the variable cutoff frequency filter that is capable of changing the gain and cutoff frequency. The variable resister includes a plurality of resister segments in the variable resister and, when a plurality of resistance candidates for the variable resister are arranged in order of size, the resistance candidates form a geometric series.

39 Claims, 13 Drawing Sheets

(a)                (b)

(c)                (d)

VARIABLE RESISTER HAVING RESISTANCE VARYING GEOMETRICALLY RATIO AND CONTROL METHOD THEREOF

PRIORITY

This application claims the benefit under 35 U.S.C. §119 (a) of a Korean patent application filed on Jul. 26, 2010 in the Korean Intellectual Property Office and assigned Serial No. 10-2010-0071867, the entire disclosure of which is hereby incorporated by reference.

BACKGROUND OF THE INVENTION

1. Field of the Invention

The present invention relates to an analog amplifier and an analog filter for amplifying an analog signal. More particularly, the present invention relates to a method for controlling the gain and cutoff frequency exponentially in the variable gain amplifier and variable frequency filter that is capable of changing the gain and cutoff frequency.

2. Description of the Related Art

Typically, a digital variable resister used in an analog amplifier or an analog filter includes one or more segments, each of which connects to a switch, such that the total resistance of the variable resister is programmed depending on the connection states of the switches by a digital control signal.

FIG. 1 is a diagram illustrating a binary variable resister programmed according to a digital control signal according to the related art.

Referring to FIG. 1, the binary variable register 100 is composed of a plurality of segments 101 and a plurality of switches 102 respectively interposed between the segments 101. The connection states of the switches 102 between the resister segments 101 are controlled by N-bit control signals $b_0$ to $b_{N-1}$. Assuming that the resistance of the smallest unit resister of the resister segment 101 is R, the resistances of the resister segments 101 of the binary variable resister are set to R, $2^2R$, ..., $2^{N-1}R$. The connection states of the switches 102 are determined according to the N-bit control signal to change the resistance of the entire binary variable resister 100.

In the case of the binary variable resister 100 depicted in FIG. 1, the total resistance of the binary variable resister 100 is determined in proportion to an integer generated by combining N bits of $b_0$ to $b_{N-1}$ of the control signal. Here, k satisfies $(k+b_0+2^1b_1+2^2b_2+ ... +2^{N-1}b_{N-1}, 0 \le k \le 2^N-1)$. In a case of applying the binary variable resister 100 to an operational amplifier (not shown) as its input resister or to a feedback resister, the gain value is determined in proportion to the input resister or feedback resister so as to obtain the gain value proportional to or inversely-proportional to the integer k.

FIG. 2 illustrates relationships among voltage gain of a variable gain amplifier formed with a variable resister and an operational amplifier, decibel (dB) of the voltage gain, and the control signal k according to the related art. Assuming that the gain obtained in the case that the integer k generated by combining N bits of the control signal is 1, the total gain of the variable gain amplifier increases linearly as k increases (G, 2G, 3G, ...).

FIG. 3 is a graph illustrating a relationship between the decibel value of the gain according to the frequency of a normal loss pass filter and the frequency to explain the cutoff frequency according to the related art. The size of most signals existing in nature such as electric wave, sound, and light increases exponentially such that it is advantageous to express the gain and cutoff frequency on a log scale in an analog circuit for the following signal processes. In the case of expressing the gain value on a log scale, the unit of decibel obtained by applying log to the gain and multiplying by 20 (10 in case of voltage) is used in general. A normal filter varies in output gain to input as the frequency value increases, and there are the pass band and stop band. The cutoff frequency ($f_c$) denotes the boundary frequency between the pass band and stop band. In a case of low pass filter, the frequency having the gain value lower by as much as 3 decibels as compared to the gain of the direct current or low frequency of the pass band is defined as $f_c$. As shown in FIG. 3, the gain value in direct current is $A_{dc}$ (dB), and the gain value at the stop frequency $f_c$ is $A_{dc}-3$ (dB), i.e., lower by as much as 3 decibels as compared to the gain value in direct current.

FIG. 4 is a circuit diagram illustrating an amplifier using the variable resister of FIG. 1 according to the related art.

Referring to FIG. 4, the amplifier 150 is capable of changing the gain and cutoff frequency by adjusting the resistance of the variable resisters 160 and 170. The gain and cutoff frequency of the amplifier of FIG. 4 in direct current are as follows.

$$\text{Gain: } \frac{R_b}{R_a}, f_c: \frac{1}{2\pi R_b C}$$

Here, $R_a$ denotes the resistance of the input variable resister 160, $R_b$ denotes the resistance of the feedback variable resister 170, and C denotes capacitance of the capacitor 180.

At this time, the following process is performed in order to change the cutoff frequency on the log scale linearly in dB under a predetermined gain value.

The ideal resistance of the feedback variable resister 170 is calculated to obtain a specific cutoff frequency value and set the value closest to the idle resistance among the resistance values available for the feedback variable resister 170 to $R_b$.

The ideal resistance of the input variable resister 160 is calculated to maintain the gain regularly and set the value closest to the ideal resistance among the resistance values available for the input variable resister 160 to $R_a$.

Referring to FIGS. 1, 2, and 4, the resistances of the variable resisters 100, 160, and 170 vary linearly and their cutoff frequencies are inversely proportional to the resistances. Referring to FIG. 2 in which the resistances of the variable resisters 100, 160, and 170 are depicted on a log scale, the resistance values of the variable resisters 100, 160, and 170 vary fast (on a log scale) with a low value of k while they vary slowly (on a log scale) with the high value of k.

In a case where the resistance $R_b$ of the feedback variable resister is lowered to increase the cutoff frequency, a failing configuration of the value for determining an accurate cutoff frequency may occur. That is, since the accuracy of the change of the cutoff frequency linearly on a log scale is limited by changing the resistance of the feedback variable resister 170, it is difficult to find the ideal resistance and thus an approximate value is taken. This is the case for the input variable resister 160 in which it is ideal for the resistance to vary in proportion to that of the feedback variable resistance 170, such that the approximate value rather than logically calculated value is taken, resulting in a problem of variation of the cutoff frequency $f_c$ and gain. That is, a significant quantization error occurs.

Also, another problem occurs in the bandwidth of the cutoff frequency. The cutoff frequency varies according to the resistance of the feedback variable resister 170 such that, although it is easy to obtain the approximate value close to the ideal resistance since the change of cutoff frequency becomes sensitive to the unit resistance variation with the high resistance in the low frequency bandwidth, there is a shortcoming in that it is difficult to obtain the approximate value close to the ideal resistance since the total resistance is low in the high frequency bandwidth.

FIG. 5 is a graph illustrating variation of gain according to frequency in a case of using the amplifier of FIG. 4 according to the related art. Due to the aforementioned causes, although it is necessary to be constant on a log scale, the cutoff frequency shows a difference of intervals and also the gain value which should be maintained constantly varies.

For these reasons, it is difficult to control the variable gain amplifier or filter using the binary variable resister of the related art and thus there is a need of a variable resister formed in a new structure to control the cutoff frequency precisely in high frequency band and to reduce the quantization error.

SUMMARY OF THE INVENTION

Aspects of the present invention are to address at least the above-mentioned the problems and/or disadvantages and to provide at least the advantages described below. Accordingly, an aspect of the present invention is to provide a variable resister circuit that is capable of minimizing errors caused by quantization of the gain of the variable gain amplifier regardless of frequency band.

Another aspect of the present invention is to provide a variable resister circuit and a variable gain amplifier circuit that are capable of configuring the variable gain for the user to check intuitively with a control code.

Another aspect of the present invention is to provide a variable resister and a variable gain amplifier that are capable of defining the gain simply by a difference between control codes of variable resisters in a case of implementing the variable gain amplifier with a plurality of variable resisters.

Another aspect of the present invention is to provide a variable resister and a variable cutoff frequency filter circuit that are capable of defining the cutoff frequency of the variable cutoff frequency filter even in the high frequency band which is used frequently.

Another aspect of the present invention is to provide an analog circuit that allows the user familiar with the variable gain expressed in units of decibel (dB) or processing log value of the cutoff frequency to understand intuitively.

Another aspect of the present invention is to provide a variable resister of which resistance increases exponentially as the control code increases.

According to an aspect of the present invention a variable resister is provided. The variable resister includes a plurality of resister segments and a plurality of switches controlling connection states of the resister segments.

The switches are closed or opened in response to individual bits ($b_0, b_1, \ldots, b_{N-1}$) of a control signal of N bits or combinations of the individual bits ($b_0 b_1, b_0 b_2, b_1 b_2, \ldots, b_0 b_2 b_3 \ldots b_{N-3} b_{N-2} b_{N-1}$, etc.) to control the connection states of the resister segments.

The resistances of the individual resister segments are determined according to a predetermined rule. The resistances of the individual resister segments are determined according to the approximation coefficients of the individual bits ($b_0, b_1, \ldots, b_{N-1}$) for controlling the corresponding switches or the bit combination ($b_0 b_1, b_0 b_2, b_1 b_2, \ldots, b_0 b_2 \ldots b_{N-2} b_{N-1}$, etc.). The approximation coefficients of the individual bits ($b_0, b_1, \ldots b_{N-1}$) or the bit combination ($b_0 b_1, b_0 b_2, b_1 b_2, \ldots, b_0 b_2 \ldots b_{N-2} b_{N-1}$, etc.) are approximated by Taylor approximation of the log function of the N-bit control signal. At this time, the log function is the log function to the integer k obtained by combination of the N-bit control signal, and the integer k is expressed by the following Equation:

$$(k=b_0+2^1 b_1+2^2 b_2+ \ldots +2^{N-1} b_{N-1}, 0 \leq k \leq 2^N-1)$$

The variable gain filter uses a variable resister having the resistance varying exponentially to the integer k obtained by combination of N-bit control signal. In case of intending to vary the value of the cutoff frequency uniformly in log scale, it is required to change the integer k of the variable resister uniformly so as to change the resistance exponentially such that the value of the cutoff frequency varies uniformly in log scale intuitively.

Also, the variable gain filter uses a plurality of variable resisters having resistance varying exponentially to integer k obtained by combination of N-bit control signal. In a case of intending to maintain the gain uniformly while varying the value of the cutoff frequency uniformly, it is required to change the value of the cutoff frequency, integer $k_a$ of the variable resister $R_a$ determining gain value, and integer $k_b$ of the variable resister $R_b$ determining gain value in the same size so as to change the resistance exponentially, whereby it is possible to maintain the gain value uniformly while changing the value of the cutoff frequency uniformly in log scale.

Other aspects, advantages, and salient features of the invention will become apparent to those skilled in the art from the following detailed description, which, taken in conjunction with the annexed drawings, discloses exemplary embodiments of the invention.

BRIEF DESCRIPTION OF THE DRAWINGS

The above and other aspects, features, and advantages of certain exemplary embodiments of the present invention will be more apparent from the following description taken in conjunction with the accompanying drawings, in which.

Throughout the drawings, it should be noted that like reference numbers are used to depict the same or similar elements, features, and structures.

DETAILED DESCRIPTION OF EXEMPLARY EMBODIMENTS

Figure 1:
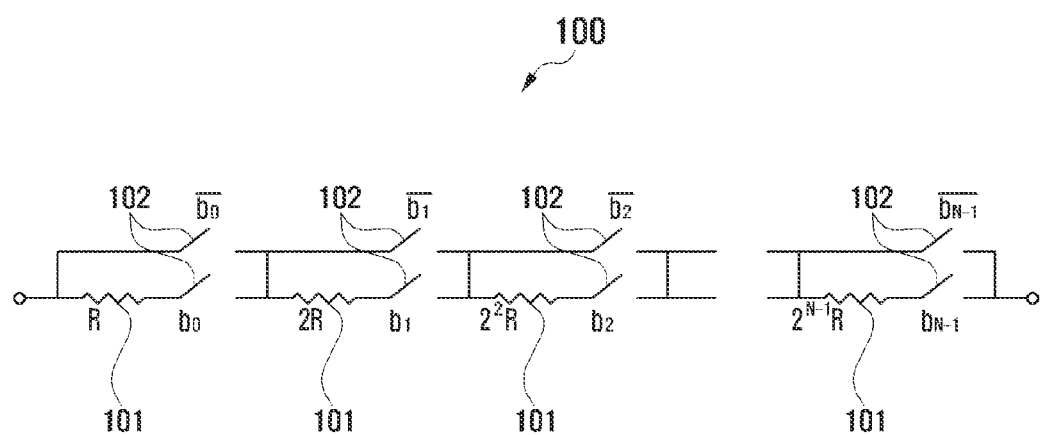
FIG. 1 is a diagram illustrating a binary variable resister programmed according to a digital control signal according to the related art.
Figure 2:
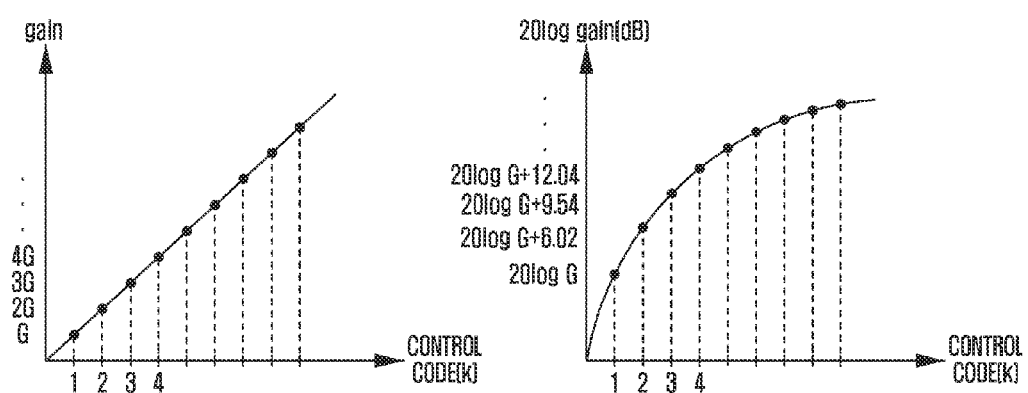
FIG. 2 illustrates relationships among voltage gain of a variable gain amplifier formed with a variable resister and an operational amplifier, decibel (dB) of the voltage gain, and the control signal k according to the related art.
Figure 3:
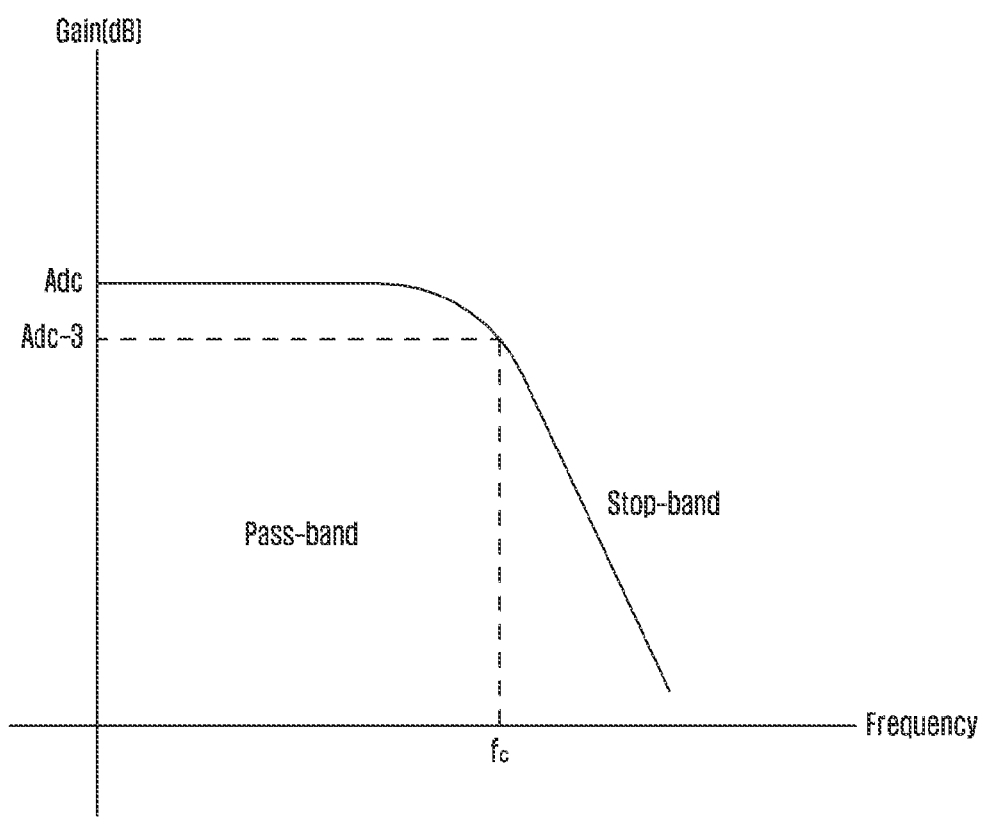
FIG. 3 is a graph illustrating a relationship between the decibel value of the gain according to the frequency of a normal loss pass filter and the frequency to explain the cutoff frequency according to the related art.

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. In addition, descriptions of well-known functions and constructions may be omitted for clarity and conciseness.

The terms and words used in the following description and claims are not limited to the bibliographical meanings, but, are merely used by the inventor to enable a clear and consistent understanding of the invention. Accordingly, it should be apparent to those skilled in the art that the following description of exemplary embodiments of the present invention is provided for illustration purpose only and not for the purpose of limiting the invention as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

The length, circumference, and thickness measurements of the components depicted in the drawings can be modified to be applied to the actual products, and it is obvious to those skilled in the art that such modification is in the scope of the present invention.

Figure 6:
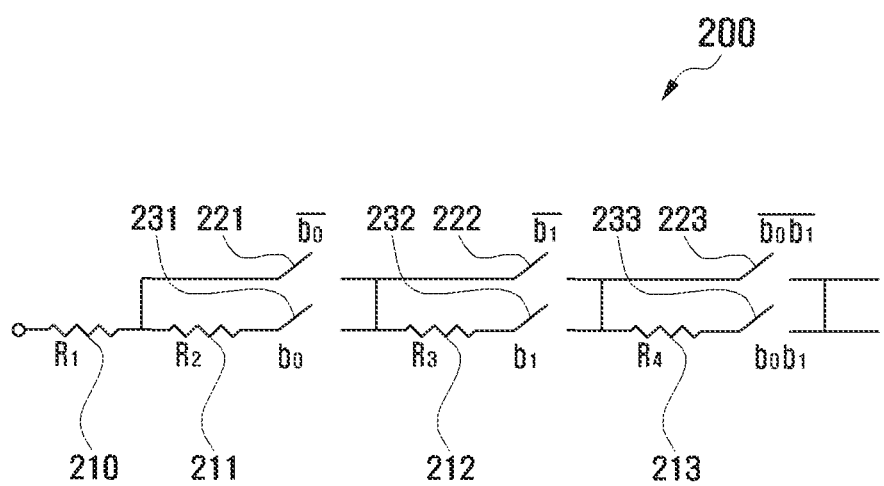
FIG. 6 is a circuit diagram illustrating a variable resister according to an exemplary embodiment of the present invention.

FIG. 6 is a circuit diagram illustrating a variable resister according to an exemplary embodiment of the present invention.

Referring to FIG. 6, the variable resister is composed of a first resister segment 210, second segments 211, 212, and 213 connected to the first segment 210 in series, first switches 221, 222, and 223 connected to the respective second resister segments 211, 212, and 213 in parallel, and second switches 231, 232, and 233 connected in series.

Although the resistance of the variable resister 200 is controlled by the control signal of 2 bits ($b_0$, $b_1$) in FIG. 6, the number of bits of the control signal is not limited thereto. The variable resister 200 includes the first resister segment 210, the second resister segments 211, 212, and 213, the first switches 211, 222, and 223 connected to the second resister segments 211, 212, and 213 in parallel and of which connection states are changed selectively according to the 2-bit control signal, and the second switches 231, 232, and 233 connected to the second resister segments 211, 212, and 213 in series. The control signal applied to the first switches 211, 222, and 223 and the control signal applied to the second switches 231, 232, and 233 are in a complementary relationship. Accordingly, one of the first switch 221 and the second switch 231 to the resister $R_2$ 211 is closed while the other is opened.

The resistance of the variable resister 200 can be expressed as an exponential function to the integer (control code) $k(=b_0+2b_1)$ as the combination of the 2 bits of the control signal. For example, the resistance can be expressed by Equation (1).

$$R = R_{lsb} \times 2^{\frac{k}{2^N}} \tag{1}$$

Here, as the control code k increases, the total resistance R of the variable resister increases exponentially, and the reference resistance is $R_{lsb}$.

Although the circuit of FIG. 6 is designed such that the total resistance R of the variable resister increases exponentially as the control code k increases, it is possible to design the circuit such that the total resistance R of the variable resister increases exponentially as the code word k decreases according to the configuration of the switch and logical circuit, and it is obvious to those skilled in the art that such a modification is included in the scope of the present invention.

The values of the first resister segment 210 and the plural second resister segments 211, 212, and 213 satisfying Equation (1) are given as the coefficients of the linear relational expression and can be obtained using Taylor approximation of the exponential function. In an exemplary implementation, the approximation coefficients of the individual bits ($b_0$, $b_1$, ..., $b_{N-1}$) or the bit combination ($b_0b_1$, $b_0b_2$, $b_1b_2$, ..., $b_0b_2$ ... $b_{N-2}b_{N-1}$, etc.) are approximated by Taylor approximation of the log function of the N-bit control signal. At this time, the log function is the log function to the integer k obtained by combination of an N-bit control signal, and the integer k is expressed by Equation (2).

$$(k=b_0+2^1b_1+2^2b_2+\ldots+2^{N-1}b_{N-1}, 0 \le k \le 2^N-1) \tag{2}$$

Equation (3) is derived by applying Taylor approximation to the exponential function of Equation (1).

$$R = R_{lsb} \times 2^{\frac{k}{2^N}} \tag{3}$$
$$= R_{lsb} \times \left(1 - \log 2 \times \frac{k}{2^N} + \frac{1}{2!}\left(\log 2 \times \frac{k}{2^N}\right)^2 + \frac{1}{3!}\left(\log 2 \times \frac{k}{2^N}\right)^3 + \ldots\right)$$

If the control signal is 2 bits, $k(=b_0+2b_1)$ and thus Equation (3) can be expressed by Equation (4).

$$R = R_{lsb} \times 2^{\frac{k}{2^N}} \tag{4}$$
$$= c_0 + c_1b_0 + c_2b_1 + c_3b_0b_1$$

If the Taylor approximation is applied to the exponential function, the true value and approximate value converge so as to approximate in the target range, e.g., by calculating up to 18 terms.

Equation (4) includes two bits ($b_0$, $b_1$) and a multiplied term ($b_0b_1$) of two different bits.

If substituting the resistances $R_1$, $R_2$, $R_3$, and $R_4$ of the first resister segment 210 and the second resister segments 211, 212, and 213 to $c_0$, $c_1$, $c_2$, and $c_3$, the control code k expressed by the two bits ($b_0$, $b_1$) of the control signal increases and, as a consequence, the resistance of the variable resister 200 increases exponentially. The reference resistance $R_{lsb}$ as the reference of the resistance of the variable resister 200 corresponds to the resistance of the first resister segment 210. In the circuit depicted in FIG. 6, the first switches 221, 222, and 223, and the second switches 231, 232, and 233 are connected to both the second resister segments 211, 212, and 213 and the bypass parts.

In a case where the switch is closed, the parasitic resistance should be 0 but in real world implementations the parasitic resistance will be a value other than 0. Accordingly, in a case of implementing a 2-bit variable resister as a real circuit, the resistances of the first resister segment 210 and the second resister segments 211, 212, and 213 can be adjusted in consideration of the parasitic resistance in the close state of the switch.

A description is made of the process for adjusting the resistances of the resister segments 210, 211, 212, and 213 in consideration of the parasitic resistances of the switches 221, 222, 223, 231, 232, and 233.

In FIG. 6, the first resister segment 210 and the second resister segments 211, 212, and 213 are connected in series, the first switches 221, 222, and 223 are connected to the respective second resister segments 211, 212, and 213 in parallel, and the second switches 231, 232, and 233 are connected in series.

Since one of the first switches 211, 222, and 223 and the second switches 231, 232, and 233 are closed to the second segments 211, 212, and 213, the number of switches connecting two ends of the variable resister 200 is 3 regardless of the control code k. For example, if k=0, the three switches 221, 222, and 223 are closed; if k=1, the three switches 231, 222, and 223 are closed; if k=2, the three switches 221, 232, and 223 are closed; and if k=3, the three switches 231, 232, and 233 are closed. Accordingly, the circuit of FIG. 6 is capable of minimizing the influence of the parasitic resistance when the first switches 221, 222, and 223, and the second switches 231, 232, and 233 are closed.

The smallest resistance $R_{lsb}$ available for the variable resister 200 can be expressed as the sum of the resistance $R_1$ of the first resister segment 210 and parasitic resistances when the first and second switches 221, 222, 223, 231, 232, and 233 are closed. Accordingly, the value obtained by subtracting the parasitic resistance from the reference resistance $R_{lsb}$ of the variable resister 200 can be adjusted to the resistance $R_1$ of the first resister segment 210.

Meanwhile, if the parasitic resistance is very small and thus ignorable as compared to the reference resistance, the resistance adjustment process can be omitted.

Figure 7:
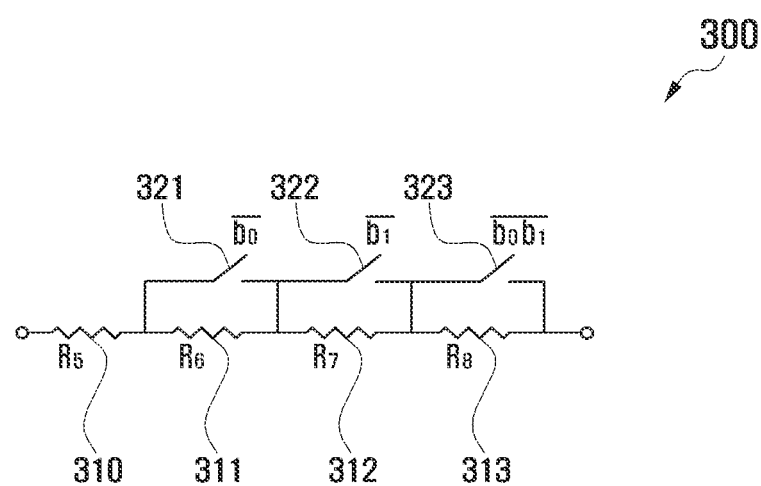
FIG. 7 is a circuit diagram illustrating a variable resister according to an exemplary embodiment of the present invention.

FIG. 7 is a circuit diagram illustrating a variable resister according to an exemplary embodiment of the present invention. The circuit of FIG. 7 is logically equivalent to the circuit of FIG. 6.

Referring to FIG. 7, the variable resister 300 includes a first resister segment 310 and a plurality of second resister segments 311, 312, and 313 connected to the first resister segment 310 in series. The variable resister 300 also includes a plurality of switches 321, 322, and 323 connected to the respective second resister segments 311, 312, and 313 in parallel so as to change the connection states of the second resister segments 311, 312, and 313 respectively.

Similar to the variable resister 200 of FIG. 6, the resistance of the variable resister 300 of FIG. 7 increases exponentially as the control code k represented by the 2 bits ($b_0$, $b_1$) of the control signal increases, and the resistance of the variable resister 300 and the control code k satisfy Equation (4).

$$R = R_{lsb} \times 2^{\frac{k}{2^N}} \quad (4)$$
$$= c_0 + c_1 b_0 + c_2 b_1 + c_3 b_0 b_1$$

The variable resister 300 of FIG. 7 is logically equivalent to the variable resister 200 of FIG. 6 such that the basic control operations executed by the control code k are similar to each other.

Meanwhile, the variable resister 300 of FIG. 7 is capable of reducing the number of switches as compared to the variable resister 200 of FIG. 6 and is thus advantageous in that it simplifies the logical circuit including the control signal ($b_0$, $b_1$). Due to these advantages, it is possible to reduce the manufacturing cost.

The variable resister 300 of FIG. 7 is characterized in that the number of switches connecting both ends of the variable resister 300 is changed so as to be 0 to 3 according to the code word k, unlike the variable resister of FIG. 6. For example, if k=0, all the three switches 321, 322, and 323 are closed; if k=1, two switches 322 and 323 are closed; if k=2, two switches 322, and 323 are closed; and if k=3, all the three switches 321, 322, and 323 are opened, i.e., no closed switch. Accordingly, the resistances of the resister segments 310, 311, 312, and 313 are determined in consideration of the influence of the parasitic resistance according to the on/off state of the switches 321, 322, and 323.

For example, when the control code k is 0, all the switches 321, 322, and 323 are closed such that the resistance between two ends of the variable resistance is equal to the sum of the resistance of the first resister segment $R_5$ 310, the parallel equivalent resistance of the parasitic resistance of resister segment $R_6$ and the switch 321, the parallel equivalent resistance of the resister segment $R_7$ and the switch 322, and the parallel equivalent resistance of the resister segment $R_8$ and the switch 323.

Accordingly, the resistance of the first resister segment $R_5$ 310 is obtained by subtracting the parallel equivalent resistances from the reference resistance $R_{lsb}$.

According to another exemplary embodiment of the present invention, the resistance of the variable resister can be controlled by 4-bit control signal ($b_0$, $b_1$, $b_2$, $b_3$). The resistance of the variable resister increases exponentially as the integer k (k=$b_0$+2$b_1$+4$b_2$+8$b_3$) increases, and the resistance R of the variable resister is expressed by Equation (5).

$$R = R_{lsb} \times 2^{\frac{k}{2^4}} \quad (5)$$
$$= R_{lsb} \times 2^{\frac{k}{2^4}} (k = b_0 + 2b_1 + 4b_2 + 8b_3)$$
$$= c_0 + c_1 b_0 + \ldots c_{15} b_0 b_1 b_2 b_3$$

Equation (5) includes basic terms and the terms including 4 individual bits ($b_0$, $b_1$, $b_2$, $b_3$) and multiplications of two to four bits ($b_0 b_1 b_2 b_3$) and can be generalized to N bits so as to be expressed in Equation (6).

$$R = R_{lsb} \cdot 2^{\frac{k}{2^N}} (k = b_0 - 2b_1 + \ldots 2^{N-1} b_{N-1}) \cong \quad (6)$$
$$c_0 + c_1 b_0 + \ldots c_p b_0 b_1 b_2 b_3 \ldots b_{N-1}$$

Equation 6 includes basic terms and the terms including N individual bits ($b_0, b_1, b_2, b_3, \ldots, b_{N-1}$) and multiplications of two to N bits ($b_0 b_1 b_2 b_3 \ldots b_{N-1}$). In a case of configuring the circuit to satisfy Equation (6), the variable resister can be designed such that its resistance increases exponentially as the control code k increases and the reference resistance becomes $R_{lsb}$.

Figure 8:
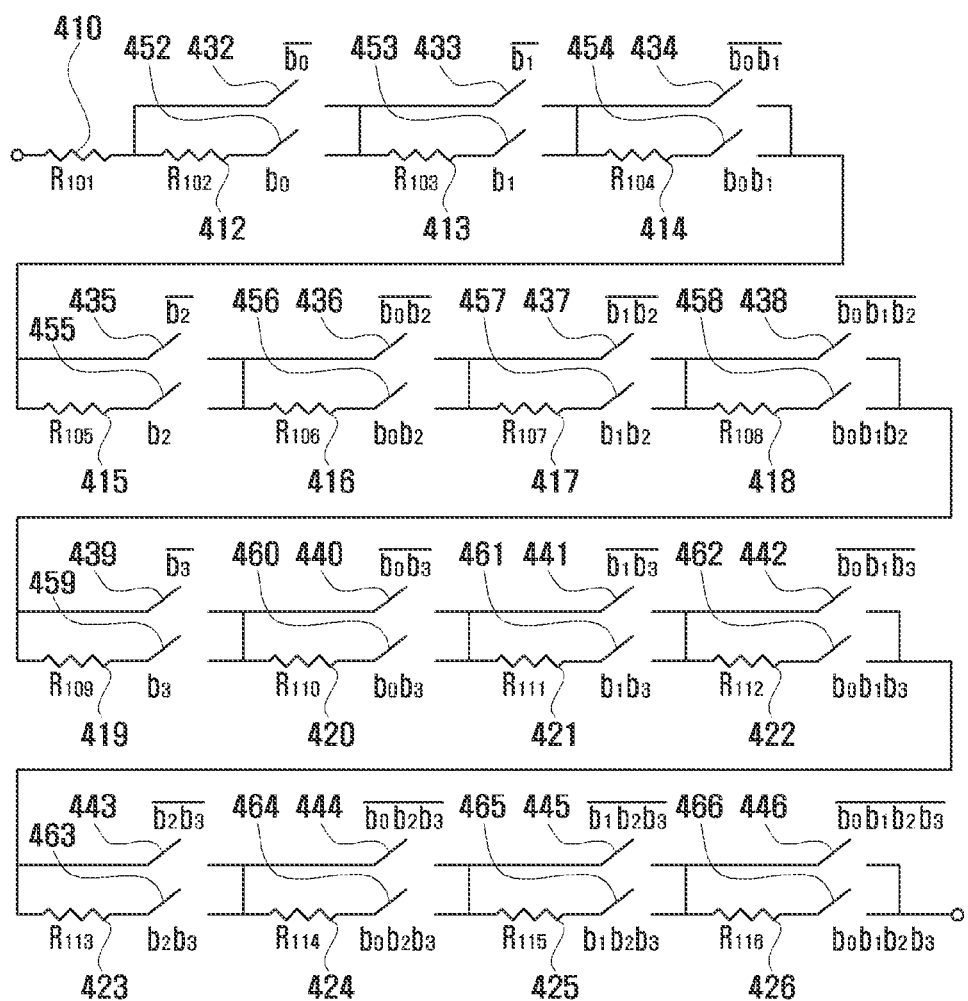
FIG. 8 is circuit diagram illustrating a configuration of a variable resister according to an exemplary embodiment of the present invention.

FIG. 8 is circuit diagram illustrating a configuration of a variable resister according to an exemplary embodiment of the present invention.

Referring to FIG. 8, the variable resister 400 includes a first resister segment 410, a plurality of second resister segments 412 to 426 connected to the first resister segment 410 in series. The variable resister 400 also includes a plurality of first switches 432 to 446 connected to the second resister segments in parallel to change the connections states of the respective second resister segments 412 to 426 and a plurality of second switches 452 to 466 connected to the respective second resister segments 412 to 426 in series.

Similar to the exemplary embodiment of FIG. 6, the control signal applied to the first switches 432 to 446 and the control signal applied to the second switches 452 to 466 are in a complementary relationship.

By substituting the resistances of the first resister segment $R_{101}$ 410 and the second resister segments $R_{102}$ to $R_{116}$ to $c_0$ to $c_{15}$ of Equation (5), the resistance of the variable resister 400 increases exponentially to k as the 4-bit control signal ($b_0, b_1, b_2, b_3$) increases. Also, the reference resistance $R_{lsb}$ as the reference to the resistance of the variable resister 400 corresponds to the resistance of the first resister segment 410.

Figure 9:
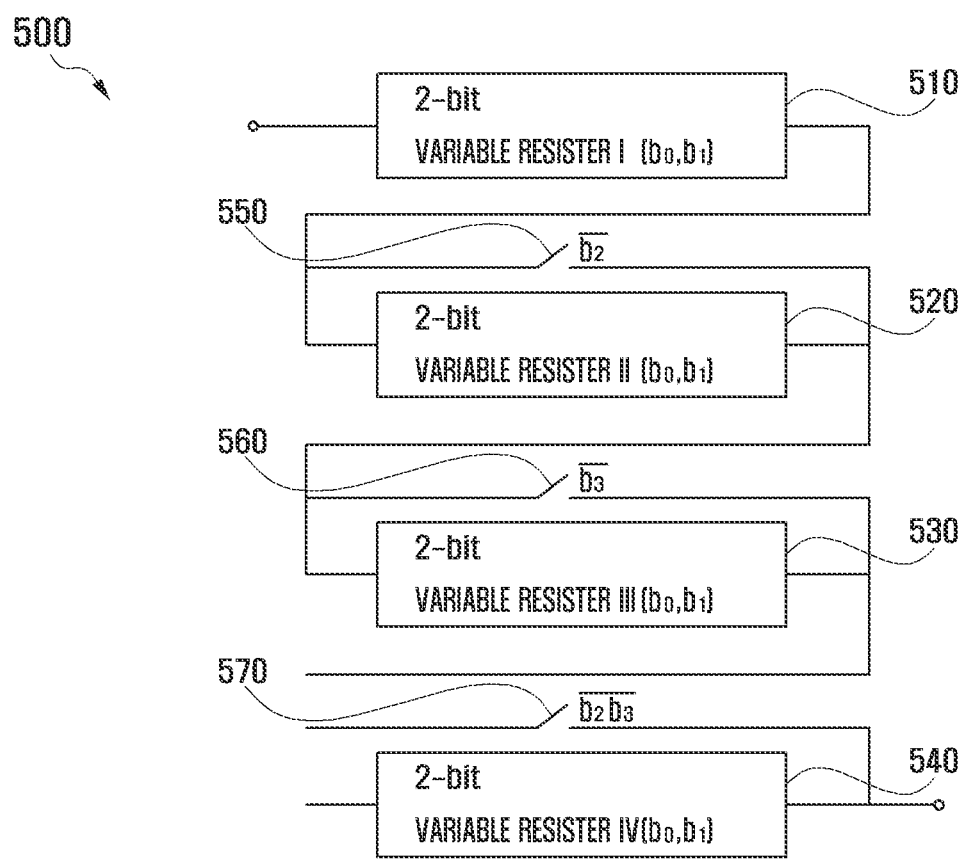
FIG. 9 is a circuit diagram illustrating a variable resister according to an exemplary embodiment of the present invention.

FIG. 9 is a circuit diagram illustrating a variable resister according to an exemplary embodiment of the present invention.

Referring to FIG. 9, the variable resister 500 includes a plurality of variable resister unit blocks 510, 520, 530, and 540 and a plurality of switches 550, 560, and 570 for changing connection state of at least one of the variable resister unit blocks 510, 520, 530, and 540. The variable resister 500 of FIG. 9 is also designed to satisfy Equation (5).

$$R = R_{lsb} \times 2^{\frac{k}{2^4}} \quad (5)$$

$$= R_{lsb} \times 2^{\frac{k}{2^4}} (k = b_0 + 2b_1 + 4b_2 + 8b_3)$$

$$= c_0 + c_1 b_0 + \ldots c_{15} b_0 b_1 b_2 b_3$$

Since it has been already explained above, a detailed description of Equation (5) is omitted herein.

The variable resister 500 is composed of a plurality of variable resister unit blocks 510, 520, 530, and 540 having inner connection states that are changed according to the control signal ($b_0, b_1$) and a plurality of switches 550, 560, and 570 for changing the connection states of the variable resister unit blocks 510, 520, 530, and 540 according to the control signal ($b_2, b_3$) so as to adjust the total resistance of the variable resister 500.

The two bits $b_0$ and $b_1$ of the 4-bit control signal ($b_0, b_1, b_2,$ and $b_3$) are used to control the internal connection states of the variable resister unit blocks 510, 520, 530, and 540 to adjust their resistances. The other two bits $b_2$ and $b_3$ are used to control the connection states of the individual variable resister unit blocks 510, 520, 530, and 540. At this time, the internal circuit of each of the individual variable resister unit blocks 510, 520, 530, and 540 can be implemented as the variable resister 200 of FIG. 6 or the variable resister 300 of FIG. 7.

In FIG. 9, the variable resister unit blocks 510 to 540 include 4 respective resister segments connected in series, and the variable resister unit blocks 510 to 540 can be configured as shown in FIG. 6 or FIG. 7. In this case, the total number of resister segments constituting the variable resister 500 is 16, and the resistance of each resister segment can increase (or decrease) geometrically. Wherein the resistance values varying geometrically comprises resistance values having a geometric series or having a value approximating a geometric series. Also, the variable resister unit blocks 510 to 540 are provided with respective switches 550 to 570 connected in parallel. The switches 550 to 570 are switched by corresponding control signals $b_2$ (4:0100), $b_3$ (8:1000), $b_2 b_3$ (12:1100) increasing by multiple of 450 to 570, and the internal switches (221 to 223 and 231 to 233 of FIGS. 6 and 321 to 323 of FIG. 7) of the individual variable resister unit blocks 510 to 540 are switching-controlled by the control signals of $b_0$ and/or $b_1$. Here, the $b_0$ and/or $b_1$ become the second control signals for selecting the resister segments of the corresponding variable resister unit blocks, and the $b_2$ and/or $b_3$ become the first control signal for selecting individual variable resister unit blocks.

Accordingly, the variable resister unit block is composed of N resister segments (N=4 in cases of FIGS. 6 and 7), and in case that the variable resister unit block is composed of M resister segments (M=4 in case of FIG. 9), if the variable resister is configured as shown in FIG. 9, the variable resister unit blocks are connected to the respective switches in parallel, the switches connected in parallel to the respective variable resister unit blocks are switching-controlled by M first control signals increasing by N-multiple, and the internal switches of the variable resister unit blocks are switched on/off by the N second control signals respectively. At this time, the total number of resister segments of the variable resister can be M*N, and these resister segments can have the resistances increasing (or decreasing) geometrically as aforementioned.

Figure 10:
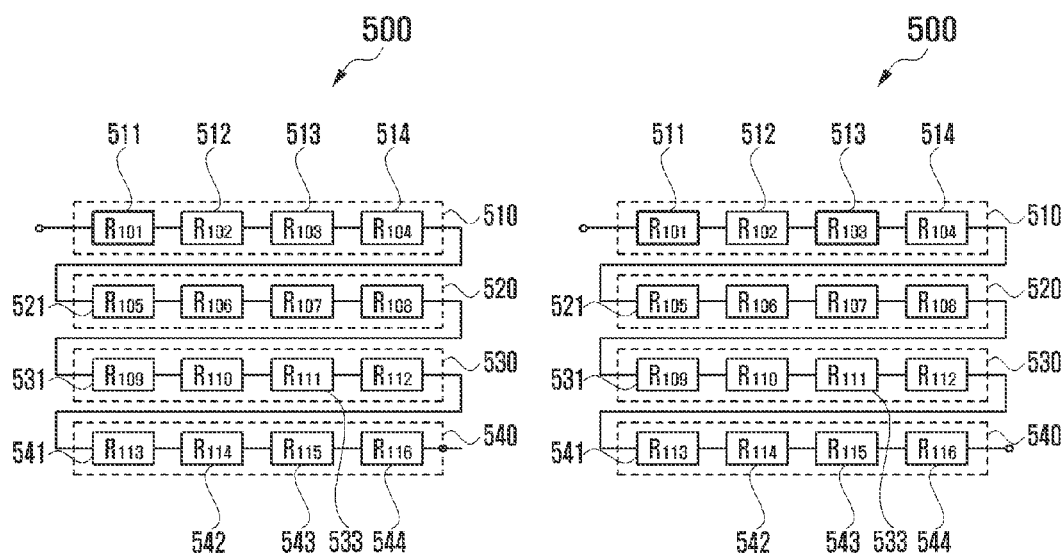
FIG. 10 is a diagram illustrating connection states and operations of the variable resister of FIG. 9 according to an exemplary embodiment of the present invention.
Figure 10:
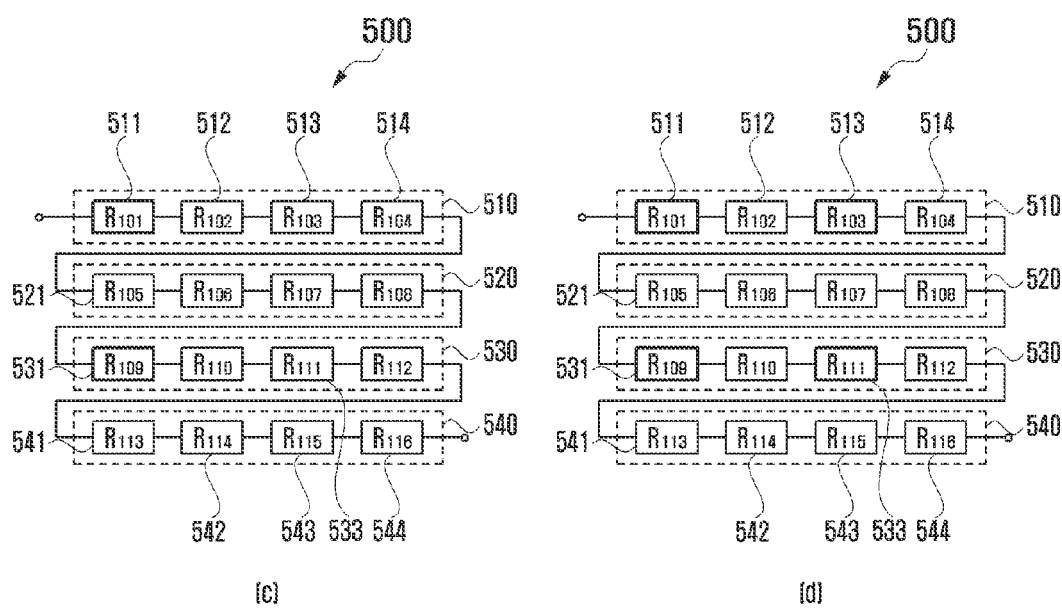

FIG. 10 is a diagram illustrating connection states and operations of the variable resister of FIG. 9 according to an exemplary embodiment of the present invention.

Referring to FIG. 10, the resister segment $R_{101}$ 511 included in the unit block 510 can correspond to $c_0$ of Equation (5), and the resister segments $R_{102}$ 512, $R_{103}$ 513, and $R_{104}$ 514 to the values of $c_1$ to $c_3$. Also, the resister segments $R_{105}$ 521, $R_{106}$, $R_{107}$, and $R_{108}$ included in the unit block 520 can correspond to $c_5$, $c_6$, $c_7$, and $c_8$ of Equation (5).

Referring to FIG. 9 again, in case of implementing a 4-bit variable resister by adjusting the resistances of the 2-bit variable resistance unit blocks 510, 520, 530, and 540 and the connection states of the individual variable resister unit blocks 510, 520, 530, and 540, it is advantageous to reduce the parasitic resistance as compared to the case where the 4-bit variable resister is implemented by controlling all the multiplications of the bits as shown in FIG. 8. For example, if $b_2=0$ and $b_3=1$, some of the variable resister unit blocks 510, 520, 530, and 540 of the variable resister of FIG. 9 are logically shorted according to the operation of the switch. In an exemplary embodiment of the present invention, only one switch exists at the part shorted by $b_2$. Accordingly, the actual resistance has the parasitic resistance of the switch, e.g., about 60 ohm. In case of implementing the 4-bit variable resister by controlling all the multiplications of bits as shown in FIG. 8, the switches 435, 436, 437, and 438 are connected but not the resisters 415, 416, 417, and 418, such that the total parasitic resistance is 4 times higher than the parasitic resistance of one switch, e.g., parasitic resistance of about 240 ohm.

Also, since the logical paths of the most significant bits ($b_2$, $b_3$) and the least significant bits ($b_0$, $b_1$) of the control signal are differentiated from each other in the variable resister 500 of FIG. 9, implementation of the logical circuit is simplified.

In an exemplary case of implementing a 6-bit variable resister (not shown), it is possible to configure 4 variable resister modules (having resister segments with different resistances) similar to the variable resister 500 of FIG. 9. The least significant bits ($b_0$, $b_1$) are used to control the internal connection states of the variable resister unit blocks, the intermediate bits ($b_2$, $b_3$) to control the connection states of the variable resister unit blocks in the variable resister module, and the most significant bits ($b_4$, $b_5$) to control the connection states of the variable resister modules. At this time, the 6-bit variable resister satisfies Equation (6) equivalently.

In a case where the variable resister unit blocks 510, 520, 530, and 540 depicted in FIG. 9 are configured as shown in FIG. 6 or FIG. 7, it is necessary to adjust the resistances of the first segment 210 (or 310) and the second segments 211, 212, and 213 (or 311, 312, and 313) in consideration of the parasitic resistances of the first switches 221, 222, and 223 (or 321, 322, and 323) and the second switches 231, 232, and 233. A description thereof is omitted herein because it has been made already above.

The operation of the variable resister of FIG. 9 is described with reference to FIG. 10.

The variable resister 500 includes a plurality of variable resister unit blocks 510, 520, 530, and 540. Each variable resister unit block includes a plurality of resister segments $R_{101}$ to $R_{116}$ (e.g., $R_{109}$, 531, $R_{111}$ 533, $R_{113}$ 541, $R_{114}$ 542, $R_{115}$ 543, $R_{116}$ 544, etc). The resistances of the variable resister unit blocks 510, 520, 530, and 540 vary according to whether the resister segments $R_{101}$ to $R_{116}$ of the variable resister unit blocks 510 are connected or closed/shorted. Also, the resistance of the variable resister 500 is changed according to the resistances of the variable resister unit blocks 510, 520, 530, and 540 and whether the variable resister unit blocks 510, 520, 530, and 540 are connected or shorted.

Part (a) of FIG. 10 shows the case where ($b_0$, $b_1$, $b_2$, $b_3$)=(0,0,0,0), i.e., k=0, only the resistance of $R_{101}$ is reflected, and the remaining resister segments $R_{102}$ to $R_{116}$ are shorted. Part (b) of FIG. 10 shows the case where ($b_0$, $b_1$, $b_2$, $b_3$)=(0,1,0,0), i.e., k=2, the resistance of $R_{101}$ and $R_{103}$ are reflected, and the remaining resister segments $R_{102}$ and $R_{104}$ to $R_{116}$ are shorted. Part (c) of FIG. 10 shows the case where ($b_0$, $b_1$, $b_2$, $b_3$)=(0,0,0,1), i.e., k=8, and the resistances of $R_{101}$ and $R_{109}$ are reflected. Part (d) of FIG. 10 shows the case where ($b_0$, $b_1$, $b_2$, $b_3$)=(0,1,0,1), i.e., k=10, and $R_{101}$, $R_{103}$, $R_{109}$, and $R_{111}$ are in connected states. Since the resistance of the variable resister 500 of FIG. 10 increases linearly in dB on the log scale as k increases, the ratio of the resistance for k=0 to the resistance for k=2 is equal to the ratio of the resistance for k=8 to the resistance for k=10. That is, the ratio of $R_{101}$ to ($R_{101}$+$R_{103}$) is equal to the ratio of ($R_{101}$+$R_{109}$) to ($R_{101}$+$R_{103}$+$R_{109}$+$R_{111}$). The relationship can formulated as $R_{103}/R_{101}$=$R_{111}/R_{109}$.

If this relationship is extended, the unit block 510 is the variable resister of which resistance increases linearly on the log scale. Also, the unit block 530 increases linearly on the log scale. Similarly, the individual unit blocks 510, 520, 530, and 540 are the variable resisters of which resistances increase linearly on the log scale.

Figure 11:
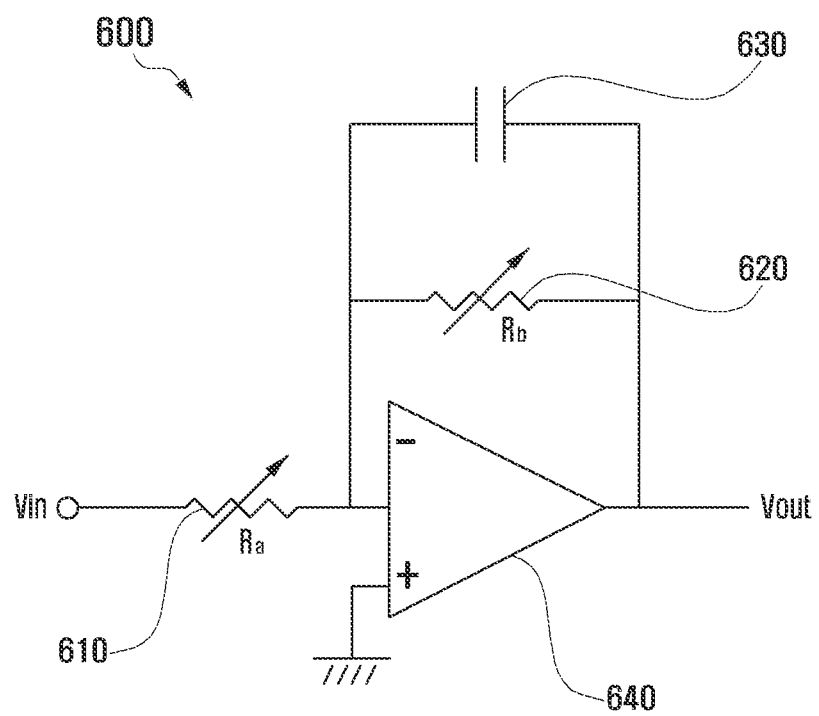
FIG. 11 is a circuit diagram illustrating a configuration of a variable gain amplifier implemented using the variable resister of one of FIGS. 6 to 10 according to an exemplary embodiment of the present invention.

FIG. 11 is a circuit diagram illustrating a configuration of a variable gain amplifier implemented using the variable resister of one of FIGS. 6 to 10 according to an exemplary embodiment of the present invention.

Referring to FIG. 11, the amplifier 600 includes variable resisters 610 and 620, a capacitor 630 connected in parallel with the variable resister 620 to reduce high frequency voltage, and an operational amplifier 640 connected to the variable resisters 610 and 620 and the capacitor 630.

Figure 4:
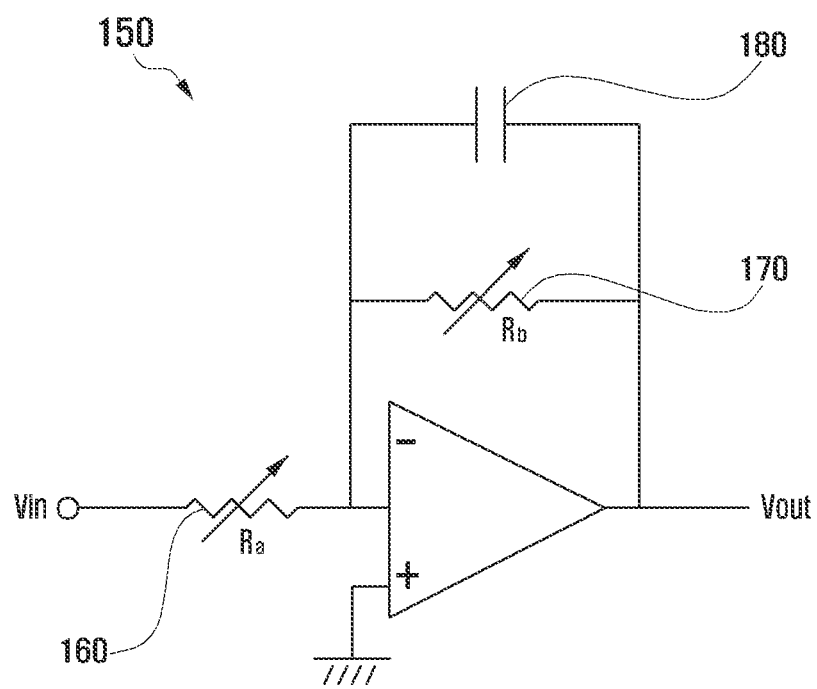
FIG. 4 is a circuit diagram illustrating an amplifier using the variable resister of FIG. 1 according to the related art.

Although the configuration of the variable resister is changed as compared to FIG. 4, the relationship among the variable resisters 610 and 620, the capacitor 630, and the operational amplifier 640 is identical with that in FIG. 4, and the gain and cutoff frequency are identical with those in FIG. 4, i.e., $$\text{Gain: } \frac{R_b}{R_a}, f_c: \frac{1}{2\pi R_b C}.$$

The amplifier 600 depicted in FIG. 11 can adjust the gain and cutoff frequency by changing the resistances of the variable resisters 610 and 620. Using the variable resister described with reference to FIGS. 6 to 10, since the resistance $R_b$ of the variable resister 620 increases linearly as the control code $k_b$ for controlling the variable resister 620 increases, it is possible to change the cutoff frequency linearly on the log scale by changing the resistance of the variable resister 620.

By adjusting the control code $k_a$ such that the difference between $k_b$ and $k_a$, is maintained uniformly, it is possible to change the gain value linearly on the log scale. That is, the gain of the amplifier depicted in FIG. 11 is determined by the difference of the control codes $k_a$ and $k_b$.

By adjusting $k_b$ linearly while maintaining the difference between $k_b$ and $k_a$ uniformly, it is possible to maintain the gain of the amplifier 600 uniformly while changing the cutoff frequency of the amplifier 600 linearly on the log scale.

Figure 12:
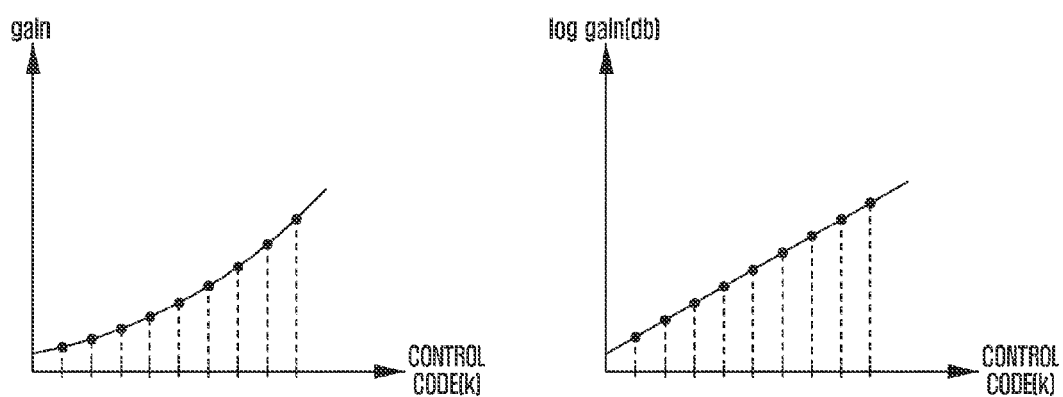
FIG. 12 illustrates a relationship between gain of a variable gain amplifier implemented with one of the variable resisters of FIGS. 6 to 10 and an integer k generated by combining a decibel value of the gain and a control signal according to an exemplary embodiment of the present invention.

FIG. 12 illustrates a relationship between gain of a variable gain amplifier implemented with the variable resisters of FIGS. 6 to 10 and an integer k generated by combining a decibel value of the gain and a control signal according to an exemplary embodiment of the present invention.

Referring to FIG. 12, after making a function which increases the resistance $R_b$ of the variable resister 620 exponentially as the control code k increases, the function is approximated linearly such that the total gain of the variable gain amplifier increases exponentially as the integer k obtained by combining N bits of a control signal increases. Since the total resistance of the variable resister 620 varies exponentially according to k, the decibel value of the gain increases linearly as k increases.

Figure 13:
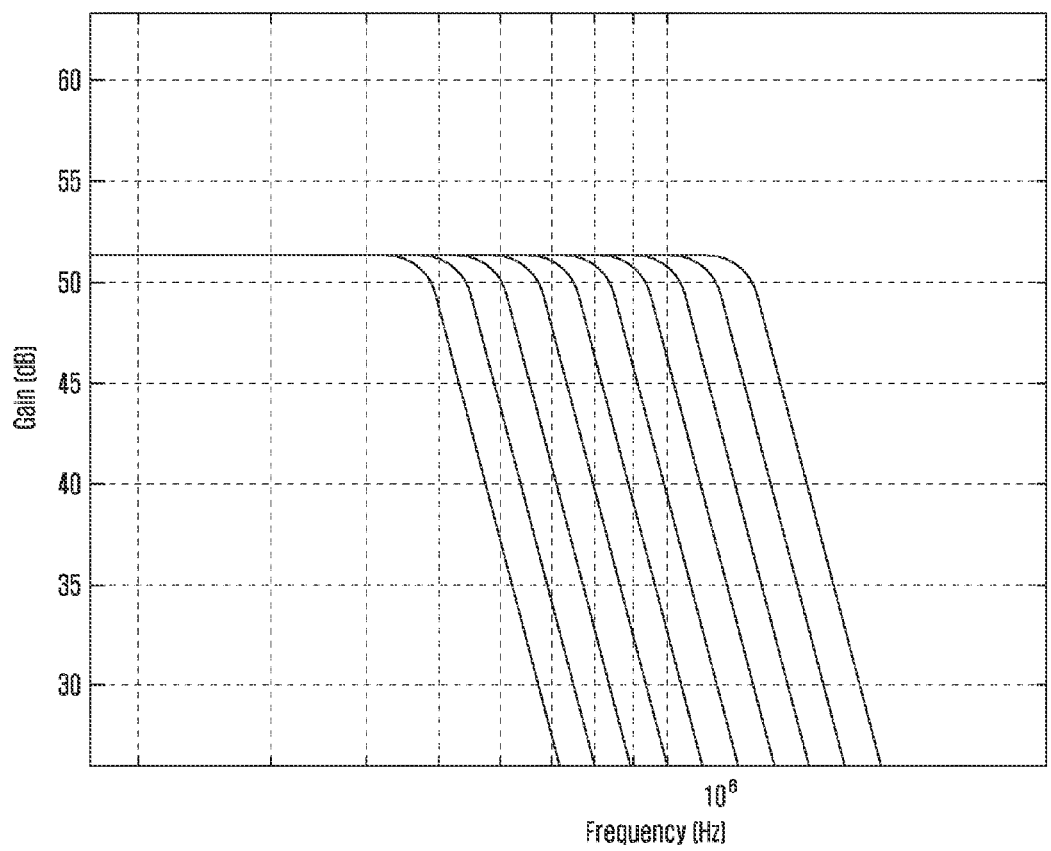
FIG. 13 is a graph illustrating variation of a gain of a variable gain amplifier implemented with one of variable resisters of FIGS. 6 to 10 according to an exemplary embodiment of the present invention.

FIG. 13 is a graph illustrating variation of a gain of a variable gain amplifier implemented with one of variable resisters of FIGS. 6 to 10 according to an exemplary embodiment of the present invention.

Figure 5:
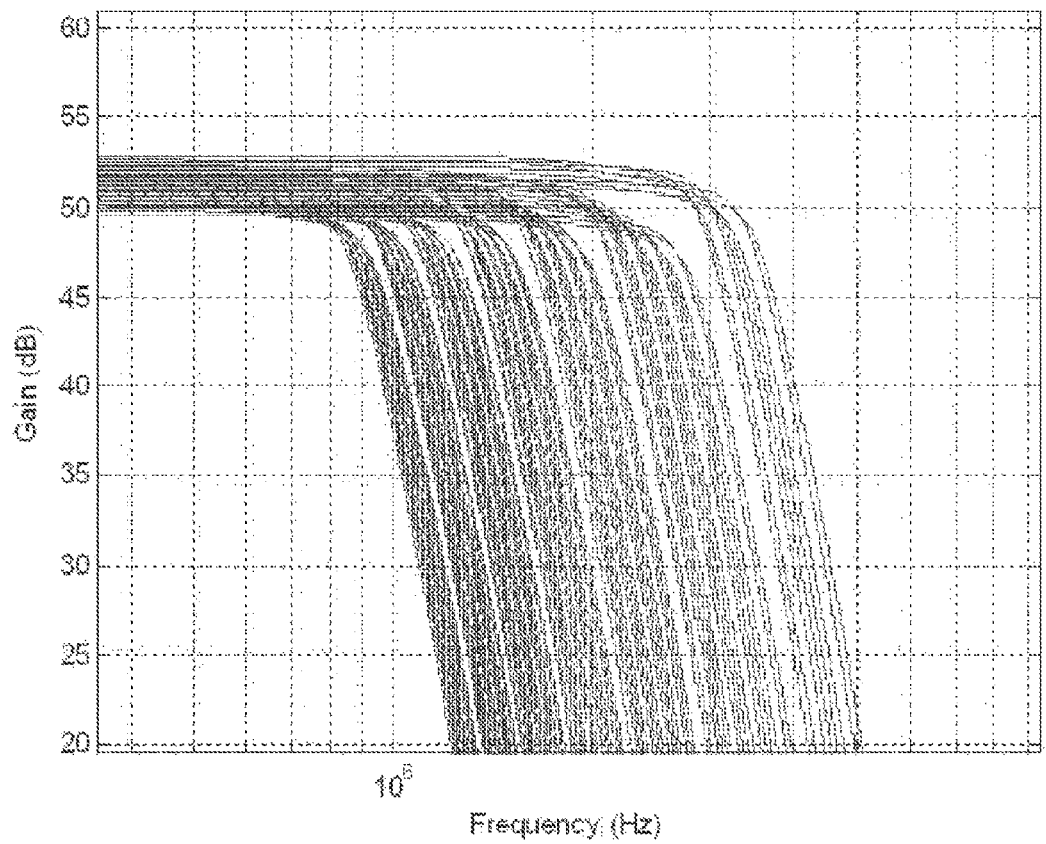
FIG. 5 is a graph illustrating variation of gain according to frequency in a case of using the amplifier of FIG. 4 according to the related art.

Referring to FIG. 13, unlike the graph of FIG. 5, the cutoff frequency varies linearly on the log scale and the error of the gain in direct current, which should be maintained uniformly in spite of the variation of the cutoff frequency, is decreased significantly as compared to the graph of FIG. 5.

As described above, exemplary embodiments of the present invention provide an efficient variable resister circuit that is capable of minimizing errors causes by quantization of the gain of the variable gain amplifier regardless of frequency band.

Also, exemplary embodiments of the present invention provide an efficient variable resister circuit and variable gain amplifier circuit that are capable of configuring the variable gain for the user to check intuitively with a control code.

Also, exemplary embodiments of the present invention provide an efficient variable resister and variable gain amplifier that are capable of defining the gain simply by difference between control codes of variable resisters in the case of implementing the variable gain amplifier with a plurality of variable resisters.

Accordingly, exemplary embodiments of the present invention negate the complicated logical circuit used for calculating the approximate value in the conventional binary variable resister so as to simplify the digital controller, reduce the manufacturing costs due to the reduced circuit size, and decrease noise of the digital logical circuit, resulting in improvement of amplifier performance.

Also, exemplary embodiments of the present invention provide an efficient variable resister and variable cutoff frequency filter circuit that are capable of defining the cutoff frequency of the variable cutoff frequency filter even in the high frequency band which is used frequently.

Also, exemplary embodiments of the present invention provide an efficient analog circuit that allows the user familiar with the variable gain expressed in units of decibel (dB) or processing log value of the cutoff frequency to understand intuitively.

Furthermore, exemplary embodiments of the present invention provide an efficient variable resister of which resistance increases exponentially as the control code increases.

The method of controlling the variable resister, variable gain amplifier, and variable cutoff frequency filter according to the exemplary embodiments of the present invention can be recorded in a computer-readable storage media in the form of program commands executable by means of various types of computing means. Also, the variable resister according to exemplary embodiments of the present invention can be used in a Radio Frequency (RF) communication circuit and modem chip of a mobile terminal.

Also, the method can be provided to the memory of a controller generating signals for controlling the variable resister, variable gain amplifier, and variable cutoff frequency filter in the form of programed software/firmware so as to be executed in a programed order.

The computer-readable media may include program commands, data files, data structures, etc. separately or compositely. The program commands recorded in the media may be particularly designed and configured for the present invention, or known and used by those skilled in the computer software field. The computer-readable media may be magnetic media such as a hard disk, a floppy disk and magnetic tape, optical media such as a Compact Disk Read-Only Memory (CD-ROM) and a Digital Versatile Disk (DVD), magneto-optical media such as floptical disk, and hardware devices such as a ROM, a Random-Access Memory (RAM), a flash memory, etc., particularly implemented to store and execute program commands. The program commands may be machine language codes produced by a compiler and high-level language codes that can be executed by computers using an interpreter, etc. In order to perform the operations of exemplary embodiments of the present invention, the hardware devices may be implemented to operate as at least one software module, and vice versa.

Although exemplary embodiments of the present invention have been described in conjunction with the limited embodiments and drawings, the present invention is not limited thereto. Those skilled in the art will appreciate that various modifications, additions and substitutions are possible from this description.

While the invention has been shown and described with reference to certain exemplary embodiments thereof, it will be understood by those skilled in the art that various changes in form and details may be made therein without departing from the spirit and scope of the invention as defined by the appended claims and their equivalents.

What is claimed is:

1. A variable resister comprising:
a plurality of resister segments,
wherein, when a plurality of resistance candidates for the variable resister are arranged in order of size, the resistance candidates have resistance values varying geometrically.

2. The variable resister of claim 1, wherein the resistance values varying geometrically comprises resistance values having a geometric series.

3. The variable resister of claim 1, wherein the resistance values varying geometrically comprises resistance values having a value approximating a geometric series.

4. The variable resister of claim 1, wherein the plurality of resistance candidates comprises a number of resister segments equal to or less than $2^N$, and the resistance of the variable resister is selected among the resistance candidates of the variable resister to vary exponentially by change of connection state of at least one of the resister segments according to a control signal of N bits.

5. The variable resister of claim 1, wherein a resistance R of the variable resister approximately satisfies a first equation as follows:

$$R = R_{lsb} \cdot 2^{\frac{k}{2^N}}$$
$$(k = b_0 + 2^1 b_1 + 2^2 b_2 + \ldots + 2^{N-1} b_{N-1},\ 0 \le k \le 2^N - 1)$$

where $R_{lsb}$ is a unit resistance that is a least among integer k generated by combination of bit values $b_0$ to $b_{N-1}$ of a control signal of N bits and the plurality of resistance candidates of the variable resister.

6. The variable resister of claim 5, wherein the resistances of the plurality of resister segments are determined to match with constant values $c_0$ to $c_p$ of a second equation, obtained by approximating the first equation to bit values $b_0$ to $b_{N-1}$ of the control signal of N bits, as follows:

$$R = R_{lsb} \times 2^{\frac{k}{2^N}}\ (k = b_0 - 2b_1 + \ldots\ 2^{N-1} b_{N-1}) \cong$$
$$c_0 + c_1 b_0 + \ldots\ c_p b_0 b_1 b_2 b_3 \ldots\ b_{N-1}.$$

7. The variable resister of claim 6, wherein the second equation and constant values $c_0$ to $c_p$ are obtained by approximating the first equation linearly in a Taylor approximation.

8. An analog signal amplifier comprising:
a variable resister comprising:
a plurality of resister segments,
wherein, when a plurality of resistance candidates for the variable resister are arranged in order of size, the resistance candidates have resistance values varying geometrically;
a loaded resister connected to the variable resister; and
an operational amplifier connected to the variable resister and the loaded resister,
wherein a gain is determined by a ratio of the variable resister to the loaded resister, and, when arranging a plurality of gain value candidates of the entire gain in order of size, the gain value candidates are changed geometrically.

9. The analog signal amplifier of claim 8, wherein the analog signal amplifier takes one of the loaded resister and the variable resister,
a plurality of first resister segments in the variable resister are controlled by a first control code,
a plurality of second resister segments in the variable resister are controlled by a second control code, and
the entire gain is determined by a difference between the first control code and the second control code.

10. An analog filter comprising:
a variable resister comprising:
a plurality of resister segments,
wherein, when a plurality of resistance candidates for the variable resister are arranged in order of size, the resistance candidates have resistance values varying geometrically;
a capacitor connected to the variable resister; and
an operational amplifier connected to the variable resister and the capacitor,
wherein the variable resister and the capacitor determine a cutoff frequency and, when a plurality of frequency value candidates of the cutoff frequency is arranged in order of size, the frequency value candidates vary geometrically.

11. A variable resister comprising:
a plurality of variable resister unit blocks of which resistances, when arranged in order of size, vary geometrically,
wherein the plural variable resister unit blocks are connected in series, and
a connection state between ends of the plural variable resister unit blocks are changed according to a first control signal.

12. The variable resister of claim 11, wherein each of the plurality of variable resister unit blocks comprises a plurality of resister segments of which a connection state changes according to a second control signal.

13. The variable resister of claim 12, wherein the first control signal comprises most significant bits of the second control signal.

14. The variable resister of claim 12, wherein the first control signal comprises least significant bits of the second control signal.

15. A variable resister for determining entire resistances based on a control signal, the variable resister comprising:
a first resister segment;
a plurality of second resister segments connected to the first resister segment in series; and
a first switch connected between second resister segments and controlled by the control signal,
wherein, when the entire resistances determined by the control signal are arranged in order of size, the resistance value varies geometrically from a reference resistance corresponding to a resistance of the first resister segment.

16. The variable resister of claim 15, further comprising:
a plurality of second switches respectively connected between the plurality of second resister segments and controlled by an inverse signal of the control signal,
wherein the plurality of second switches have parasitic resistance equal to a parasitic resistance of the first switch.

17. The variable resister of claim 15, wherein the resistances of the first resister segment and the plurality of second resister segments are determined in consideration of a parasitic resistance of the first switch, and the reference resistance is a sum of the resistance of the first resister segment and a parasitic resistance of the first switch.

18. A method for controlling a variable resister, the method comprising:
applying a control signal to the variable resister including a plurality of resister segments; and
determining one of a plurality of resistance candidates by changing a connection state of at least one of the plurality of resister segments according to the control signal,
wherein, when the plurality of resistance candidates available for the variable resister are arranged in order of size, the plurality of resistance candidates have the resistance values varying in geometric ratio.

19. The method of claim 18, wherein a resistance R of the variable resister approximately satisfies a first equation as follows:

$$R = R_{lsb} \cdot 2^{\frac{k}{2^N}}$$
$$(k = b_0 + 2^1 b_1 + 2^2 b_2 + \ldots + 2^{N-1} b_{N-1}, 0 \le k \le 2^N - 1)$$

where $R_{lsb}$ is a unit resistance that is a least among integer k generated by combination of bit values $b_0$ to $b_{N-1}$ of the control signal of N bits and the plurality of resistance candidates of the variable resister.

20. The method of claim 19, wherein the resistances of the resister segments are determined to match with constant values $c_0$ to $c_p$ of a second equation, obtained by approximating the first equation to bit values $b_0$ to $b_{N-1}$ of the control signal of N bits, as follows:

$$R = R_{lsb} \times 2^{\frac{k}{2^N}} (k = b_0 - 2b_1 + \ldots 2^{N-1} b_{N-1}) \cong$$
$$c_0 + c_1 b_0 + \ldots c_p b_0 b_1 b_2 b_3 \ldots b_{N-1}.$$

21. The method of claim 20, wherein the second equation and constant values $c_0$ to $c_p$ are obtained by approximating the first equation linearly in a Taylor approximation.

22. A method for controlling a variable resister, the method comprising:
outputting a first control signal for selecting variable resister unit blocks connected in series in the variable resister and having resistances varying geometrically when arranged in order of size and a second control signal for selecting resistance segments in the variable resister unit blocks; and
determining the resistance of the variable resister by selecting the variable resister unit blocks according to the first control signal and by selecting the resister segments in the variable resister unit blocks according to the second control signal.

23. A variable resister comprising:
a plurality of resister segments, and
a plurality of switches connected with the plurality of resister segments;
wherein a resistance of the plurality of resister segments are determined to vary a total resistance of the variable resister exponentially according to a changing of a connection state of the plurality of switches.

24. The variable resister of claim 23, wherein the total resistance of the variable resister varying exponentially comprises the total resistance of the variable resister having a geometric series.

25. The variable resister of claim 23, wherein the total resistance of the variable resister varying exponentially comprises the total resistance of the variable resister having a value approximating a geometric series.

26. The variable resister of claim 23, wherein the plurality of resistance segments comprises a number of resister segments equal to or less than $2^N$, and the total resistance of the variable resister is selected by changing of the connection state of at least one of the switches according to a control signal of N bits.

27. The variable resister of claim 23, wherein the total resistance R of the variable resister approximately satisfies a first equation as follows:

$$R = R_{lsb} \times 2^{\frac{k}{2^N}}$$
$$(k = b_0 + 2^1 b_1 + 2^2 b_2 + \ldots + 2^{N-1} b_{N-1}, 0 \le k \le 2^N - 1)$$

where $R_{lsb}$ is a unit resistance that is a least among integer k generated by a combination of bit values $b_1$ to $b_{N-1}$ of a control signal of N bits and a plurality of resistance candidates of the variable resister.

28. The variable resister of claim 27, wherein the resistances of the plurality of resister segments are determined to match with constant values $c_0$ to $c_p$ of a second equation, obtained by approximating the first equation to bit values $b_0$ to $b_{N-1}$ of the control signal of N bits, as follows:

$$R = R_{lsb} \times 2^{\frac{k}{2^N}} (k = b_0 - 2b_1 + \ldots 2^{N-1} b_{N-1}) \cong$$
$$c_0 + c_1 b_0 + \ldots c_p b_0 b_1 b_2 b_3 \ldots b_{N-1}.$$

29. The variable resister of claim 28, wherein the second equation and constant values $c_0$ to $c_p$ are obtained by approximating the first equation linearly in a Taylor approximation.

30. An analog signal amplifier comprising:
a variable resister comprising:
a plurality of resister segments, and
a plurality of switches connected with the plurality of resister segments,
wherein a resistance of the plurality of resister segments are determined to vary a total resistance of the variable resister exponentially according to a changing of a connection state of the plurality of switches;
a loaded resister connected to the variable resister; and
an operational amplifier connected to the variable resister and the loaded resister,
wherein an entire gain is determined by a ratio of the variable resister to the loaded resister, and, when arranging a plurality of gain value candidates of the entire gain in order of size, the gain value candidates are changed exponentially.

31. The analog signal amplifier of claim 30, wherein the analog signal amplifier takes one of the loaded resister and the variable resister,
a plurality of first resister segments in the variable resister are controlled by a first control code,
a plurality of second resister segments in the variable resister are controlled by a second control code, and
the entire gain is determined by a difference between the first control code and the second control code.

32. An analog filter comprising:
a variable resister comprising:
a plurality of resister segments, and
a plurality of switches connected with the plurality of resister segments,
wherein a resistance of the plurality of resister segments are determined to vary a total resistance of the variable resister exponentially according to a changing of a connection state of the plurality of switches;
a capacitor connected to the variable resister; and
an operational amplifier connected to the variable resister and the capacitor,
wherein the variable resister and the capacitor determine a cutoff frequency and, when a plurality of frequency value candidates of the cutoff frequency is arranged in order of size, the frequency value candidates vary linearly.

33. A variable resister for determining entire resistances based on a control signal, the variable resister comprising:
a first resister segment;
a plurality of second resister segments connected to the first resister segment in series; and
a first switch connected between second resister segments and controlled by the control signal,
wherein a resistance of the plurality of second resister segments are determined to vary a total resistance of the variable resister exponentially from a reference resistance corresponding to a resistance of the first resister segment according to a changing of a connection state of the first switch.

34. The variable resister of claim 33, further comprising:
a plurality of second switches respectively connected between the plurality of second resister segments and controlled by an inverse signal of the control signal,
wherein the plurality of second switches have parasitic resistance equal to a parasitic resistance of the first switch.

35. The variable resister of claim 33, wherein the resistance of the first resister segment and the plurality of second resister segments are determined in consideration of a parasitic resistance of the first switch, and the reference resistance is a sum of the resistance of the first resister segment and a parasitic resistance of the first switch.

36. A method for controlling a variable resister, the method comprising:
applying a control signal to the variable resister including a plurality of resister segments; and
determining a total resistance of the variable resister by changing a connection state of at least one of the plurality of resister segments according to the control signal,
wherein a resistance of the plurality of resister segments are determined to vary the total resistance of the variable resister exponentially according to the control signal.

37. The method of claim 36, wherein the total resistance R of the variable resister approximately satisfies a first equation as follows:

$$R = R_{lsb} \times 2^{\frac{k}{2^N}}$$
$$(k = b_0 + 2^1 b_1 + 2^2 b_2 + \ldots + 2^{N-1} b_{N-1}, 0 \le k \le 2^N - 1)$$

where $R_{lsb}$ is a unit resistance that is a least among integer k generated by combination of bit values $b_0$ to $b_{N-1}$ of the control signal of N bits and a plurality of resistance candidates of the variable resister.

38. The method of claim 37, wherein the resistances of the resister segments are determined to match with constant values $c_0$ to $c_p$ of a second equation, obtained by approximating the first equation to bit values $b_0$ to $b_{N-1}$ of the control signal of N bits, as follows:

$$R = R_{lsb} \times 2^{\frac{k}{2^N}}$$
$$(k = b_0 + 2^1 b_1 + 2^2 b_2 + \ldots + 2^{N-1} b_{N-1}, 0 \leq k \leq 2^N - 1).$$

39. The method of claim 38, wherein the second equation and constant values $c_0$ to $c_p$ are obtained by approximating the first equation linearly in a Taylor approximation.

* * * * *